(12) United States Patent
Tsang

(10) Patent No.: US 7,521,666 B2
(45) Date of Patent: Apr. 21, 2009

(54) MULTI-CAVITY FABRY-PEROT AMBIENT LIGHT FILTER APPARATUS

(75) Inventor: Koon Wing Tsang, Sindian (TW)

(73) Assignee: Capella Microsystems Inc., Taipei County (TW)

( * ) Notice: Subject to any disclaimer, the term of this patent is extended or adjusted under 35 U.S.C. 154(b) by 618 days.

(21) Appl. No.: 11/174,455

(22) Filed: Jul. 6, 2005

(65) Prior Publication Data

US 2006/0180886 A1 Aug. 17, 2006

(51) Int. Cl.
  *H01J 40/14* (2006.01)
  *H01J 5/16* (2006.01)
  *H01L 31/0232* (2006.01)
  *G01J 3/50* (2006.01)
(52) U.S. Cl. .................. 250/226; 359/359; 257/432
(58) Field of Classification Search .......... 250/226; 257/432; 359/359, 360
  See application file for complete search history.

(56) References Cited

U.S. PATENT DOCUMENTS

| | | | | |
|---|---|---|---|---|
| 4,158,133 A | * | 6/1979 | Spaeth et al. | 250/214 R |
| 5,521,759 A | * | 5/1996 | Dobrowolski et al. | 359/585 |
| 6,666,983 B2 | * | 12/2003 | Marietti et al. | 216/75 |
| 6,768,555 B2 | * | 7/2004 | Chen et al. | 356/519 |
| 7,095,009 B2 | * | 8/2006 | Harada et al. | 250/226 |
| 2007/0070347 A1 | * | 3/2007 | Scherer et al. | 356/326 |

* cited by examiner

*Primary Examiner*—John R Lee
(74) *Attorney, Agent, or Firm*—Rosenberg, Klein & Lee

(57) ABSTRACT

The present invention provides a multi-cavity Fabry-Perot ambient light filter apparatus. The multi-cavity Fabry-Perot ambient light filter apparatus comprises a plurality of Fabry-Perot cavities, each of the plurality of Fabry-Perot cavities covering one of a plurality of photodiodes; wherein each of the plurality of Fabry-Perot cavities has two partially reflective layers and one interferometric layer sandwiching between the two partially reflective layers, and shares one of the two partially reflective layers with a neighboring Fabry-Perot cavity and thereby stair stacking with the neighboring Fabry-Perot cavity. The plurality of Fabry-Perot cavities are capable of blocking the ambient light except for a wavelength spectrum that is recognizable for human eyes, thereby effectively accomplishes excellent IR blocking from non-visible light spectra.

20 Claims, 6 Drawing Sheets

MULTI-CAVITY FABRY-PEROT AMBIENT LIGHT FILTER APPARATUS

FIELD OF THE INVENTION

The present invention generally relates to a multi-cavity Fabry-Perot ambient light filter structure together with an array of photodiode elements to detect and convert the ambient light into electrical signal. More particularly, this invention relates to a multi-cavity Fabry-Perot ambient light filter structure capable of sensing color information of ambient light and provides blocking of infrared (IR) light within the wavelength ranging from 700 nm to 1100 nm. The multi-cavity Fabry-Perot structure senses not just the ambient light brightness but also the fundamental red, green and blue color components of the ambient light.

BACKGROUND OF THE INVENTION

Ambient light sensors are now in widespread use, including cameras, camcorders, scanners, electrical microscopes, and so forth. The function of the ambient light sensors is to detect and convert ambient light brightness into electrical signal. For instance, knowing the brightness information of the ambient light, the display system brightness could be adjusted accordingly to reduce the power consumption of the backlight illumination. For most of the conventional ambient light sensor solutions, the sensor spectral response is not matched with the ideal human eye photometric response. The non-ideal ambient light sensor has a much wider spectral response range and also there are multiple peaks exhibited within the entire photodiode detection range of 400 nm to 1100 nm. Please refer to FIG. 1, which shows a chart of spectral response regarding the wavelength spectrum of a conventional ambient light sensor. Generally, the human eyes are capable of sensing visible light within wavelength ranging between 400 nm and 700 nm 11. The response of the conventional ambient light sensor not only detect visible light in the range of wavelength spectrum like human eyes, but also captures infrared light with wavelength above 700 nm that human eye is unable to respond. Therefore, within the range between 700 nm and 1200 nm, two peaks 12 are produced without IR blocking according to the conventional ambient light sensor. Consequently, the inconsistency would be developed such that the human eye feels the ambient light is insufficient while, on the other hand, the conventional ambient light sensor senses sufficient ambient light. In other words, the ambient light sensor senses non-visible light that human eye is unable to response and the process for sensing non-visible light causes unnecessary backlight power consumption. For this reason, this invention provides a multi-cavity Fabry-Perot filter structure utilizing the Fabry-Perot optical interference theory in order to effectively block the range from 700 nm to 1100 nm and reduce power consumption, thereby both brightness and color image processing adjustments are provided.

SUMMARY OF THE INVENTION

Therefore, it is one objective of the present invention to provide a multi-cavity Fabry-Perot ambient light filter apparatus. The multi-cavity Fabry-Perot ambient light filter apparatus comprises a plurality of Fabry-Perot cavities. Each of the plurality of Fabry-Perot cavities covers one of a plurality of photodiodes. Each of the plurality of Fabry-Perot cavities has two partially reflective layers and one interferometric layer sandwiching between the two partially reflective layers, and shares one of the two partially reflective layers with a neighboring Fabry-Perot cavity, and thereby stair stacks with the neighboring Fabry-Perot cavity. The plurality of Fabry-Perot cavities is capable of blocking infrared portion of the ambient light except for a wavelength spectrum that is recognizable for human eyes.

It is another objective of the present invention to provide a multi-cavity Fabry-Perot ambient light filter apparatus, which comprises a first Fabry-Perot cavity, having a first partially reflective layer, a second partially reflective layer and a first interferometric layer deposited between the first partially reflective layer and the second partially reflective layer; a second Fabry-Perot cavity, having a third partially reflective layer, a fourth partially reflective layer and a second interferometric layer deposited between the third partially reflective layer and the fourth partially reflective layer; and a third Fabry-Perot cavity, having a fifth partially reflective layer, a sixth partially reflective layer and a third interferometric layer deposited between the fifth partially reflective layer and the sixth partially reflective layer; wherein the second Fabry-Perot cavity is stair stacked on the first Fabry-Perot cavity such that the second partially reflective layer and the third partially reflective layer share a first common partially reflective layer, and the first partially reflective layer and the fourth partially reflective layer are different partially reflective layers; and wherein the third Fabry-Perot cavity is stair stacked on the second Fabry-Perot cavity such that the fourth partially reflective layer and the fifth partially reflective layer share a second common partially reflective layer, and the third partially reflective layer and the sixth partially reflective layer are different partially reflective layers.

Thus, the multi-cavity Fabry-Perot ambient light filter structure can effectively accomplish excellent IR blocking from non-visible light spectra and the typical transmittance of less than 2% for the entire IR range of 700 nm to 1100 nm. Furthermore, the green channel spectral response of the ambient light filter structure could well match with the spectral response of human eyes by utilizing the Fabry-Perot optical cavity.

DETAILED DESCRIPTION OF THE PREFERRED EMBODIMENTS

Figure 1:
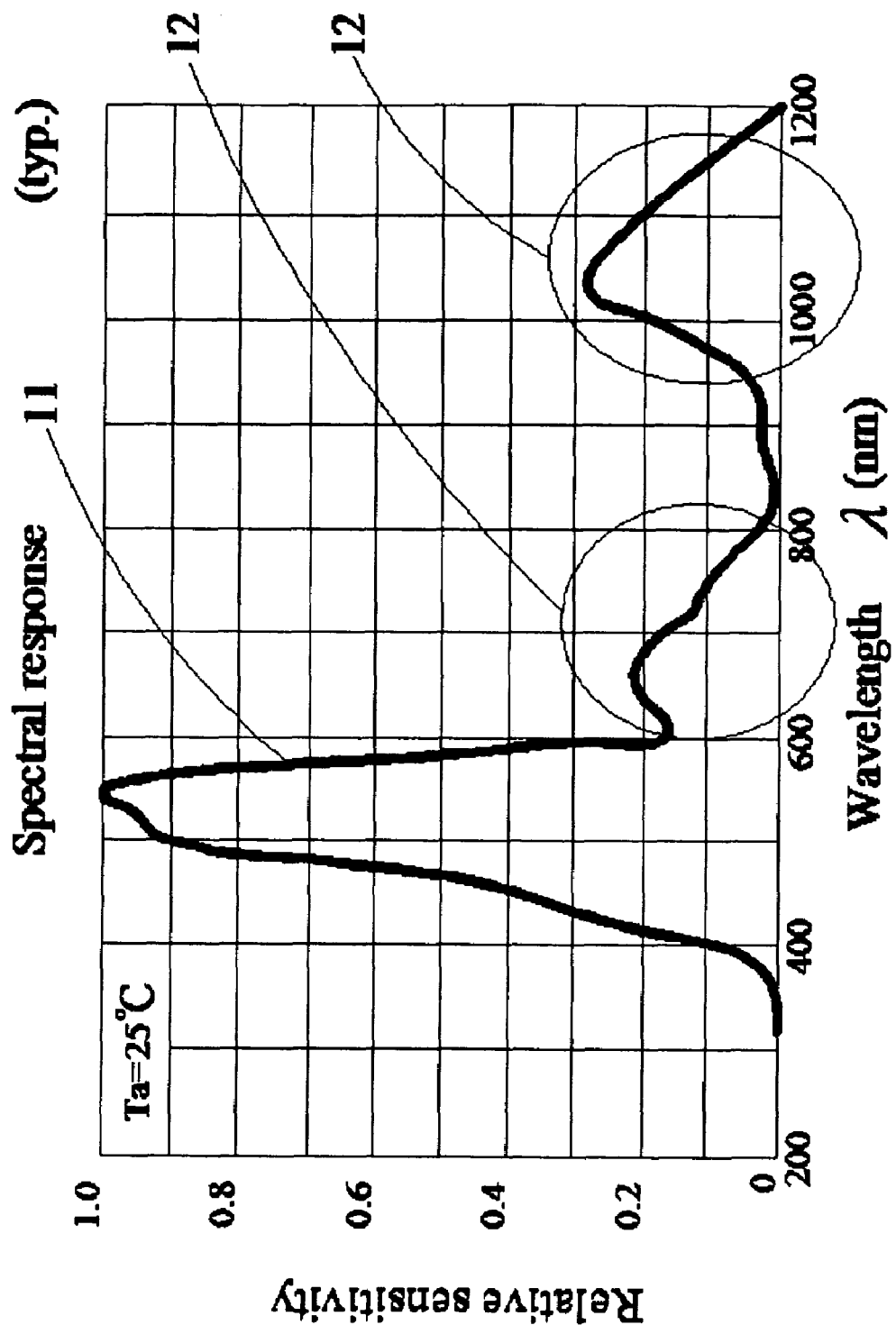
FIG. 1 is a chart of spectral response of a conventional ambient light sensor.

The preferred embodiments of the present invention will be explained below with reference to the drawing.

Figure 2:
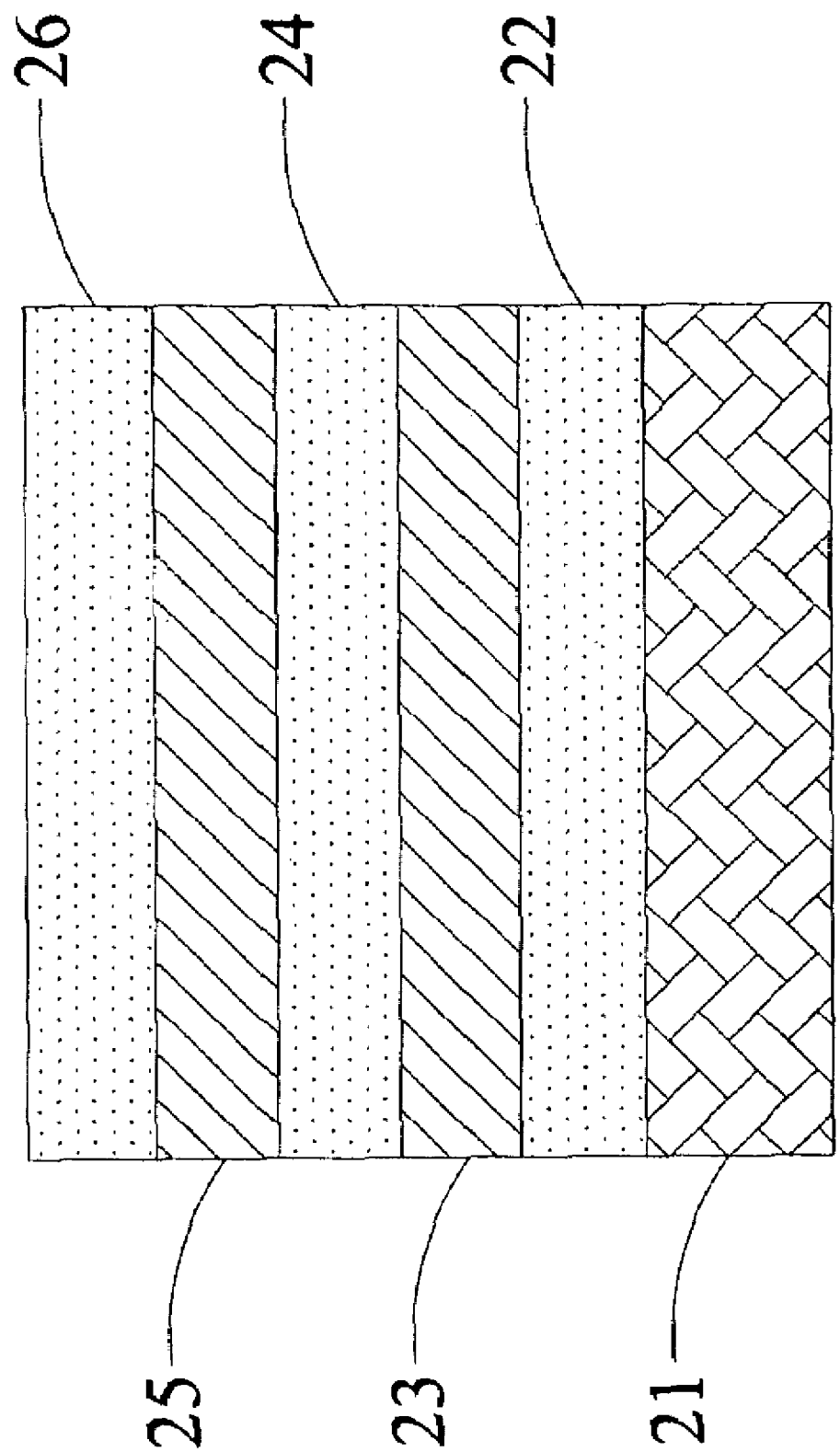
FIG. 2 is a cross-sectional diagram explaining an example of the composition of a single Fabry-Perot ambient light filter structure according to an embodiment of the present invention.

FIG. 2 shows an example of a green channel ambient light filter structure according to an embodiment of the present invention. The ambient light filter structure comprises a silicon substrate 21, a first silicon nitride ($Si_3N_4$: 3200 Å±200) thin film layer 22, a first silver (Ag: 285 Å±35) partially reflective layer 23, a second silicon nitride ($Si_3N_4$: 920 Å±50) thin film layer 24, a second silver (Ag: 285 Å±35) partially reflective layer 25, and a third silicon nitride ($Si_3N_4$: 3500 Å±200) thin film layer 26. The preferred embodiment of the present invention has a P-type silicon substrate 21 which includes an array of N+ junction a photodiode element (not shown). On top of the N+/P-type photodiode, the first silicon nitride ($Si_3N_4$: 3200 Å±200) thin film layer 22 is deposited on the silicon substrate 21, the first silver (Ag: 285 Å±35) partially reflective layer 23 is deposited on the first silicon nitride thin film layer 22, the second silicon nitride ($Si_3N_4$: 920 Å±50) thin film layer 24 is deposited on the first silver partially reflective layer 23, the second silver (Ag: 285 Å±35) partially reflective layer 25 is deposited on the second silicon nitride thin film layer 24, and the third silicon nitride ($Si_3N_4$: 3500 Å±200) thin film layer 26 is deposited on the second silver partially reflective layer 25. By way of the manufacturing process mentioned above, the single Fabry-Perot ambient light filter structure can be made and constitutes a simple five layers process plus the photodetector silicon substrate 21. The conventional all dielectric thin film photometric filters require forty-two layers of thin-film coating. The first silicon nitride thin film layer 22 is a bottom spacer layer, the first silver partially reflective layer 23 is a bottom partial reflector layer, the second silicon nitride thin film layer 24 is a center interferometric dielectric layer, the second silver partially reflective layer 25 is a top partial reflector layer, and the third silicon nitride thin film layer 26 is a top moisture protective layer. The second silicon nitride thin film layer 24 is a Fabry-Perot interferometric nitride layer, for filtering a certain spectral band of light, and a dielectric material such as silicon dioxide ($SiO_2$) or oxy-nitride may be further applied thereon. The second silicon nitride thin film layer 24 can be shaped by Plasma Enhanced Chemical Vapor Deposition (PECVD). The first silver partially reflective layer 23, the second silicon nitride thin film layer 24, and the second silver partially reflective layer 25 are formed the core of the Fabry-Perot optical cavity. The first silicon nitride thin film layer 22 and the third silicon nitride thin film layer 26 are to protect the first silver partially reflective layer 23 and the second silver partially reflective layer 25 from moisture. The ambient light filter structure can be made by the Complementary Metal Oxide Semiconductor (CMOS) technology, the bipolar technology, and the Bi-Complementary Metal Oxide Semiconductor (BiCMOS) technology. Furthermore, combining the single Fabry-Perot ambient light filter structure with a metal three light shield layer is to provide an effective stray light rejection structure for integrated electrical circuits (the metal three light shield layer is deposited between the silicon substrate). The design of the multi-cavity Fabry-Perot ambient light filter structure is based on the $1^{st}$ order optical interference theory to provide an excellent IR blocking characteristic for wavelength of 700 nm to 1100 nm.

Next, the responses of the ambient light filter structure according to the present invention and the human eye will be explained with FIG. 3.

Figure 3:
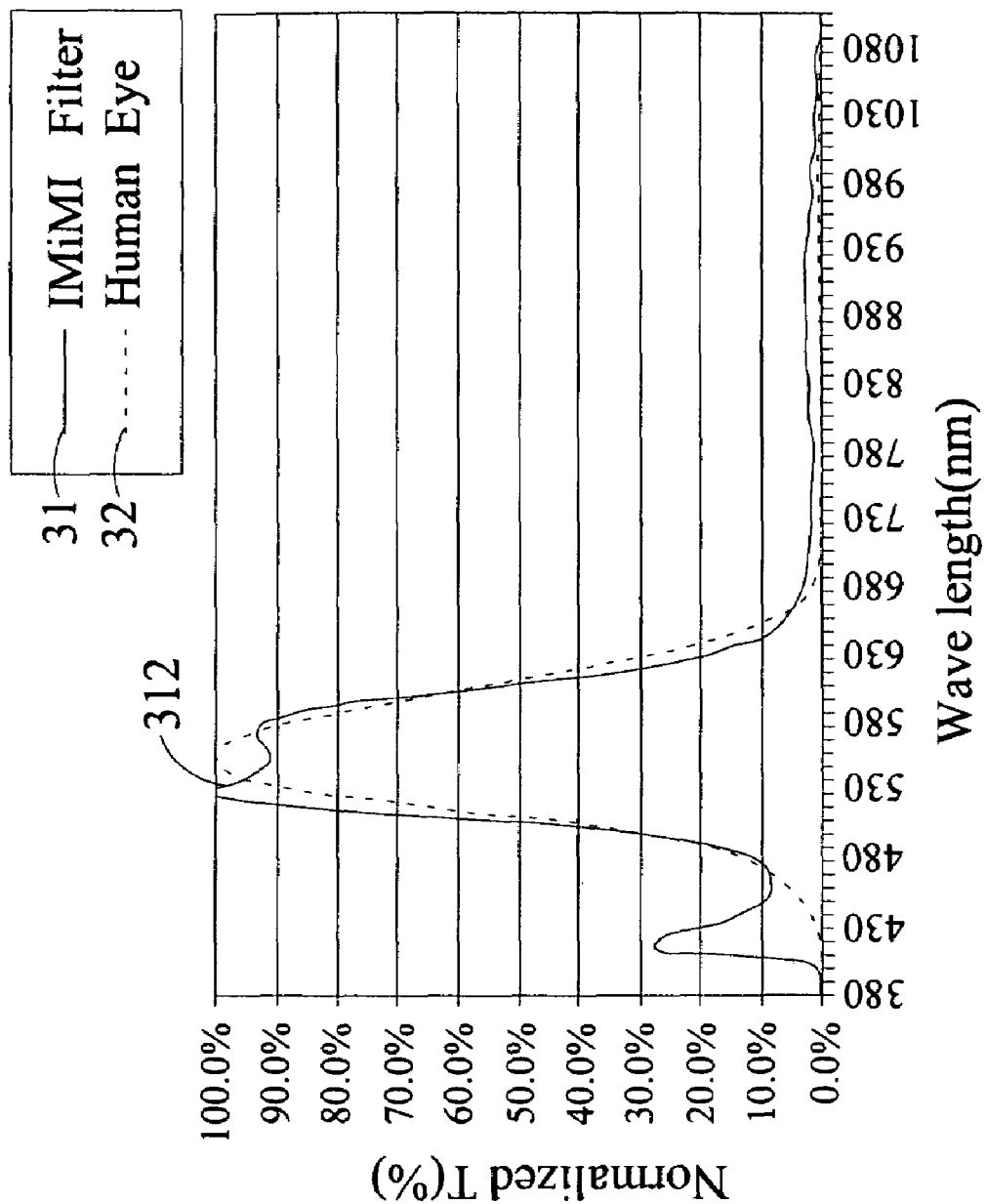
FIG. 3 is a chart of spectral responses explaining an example of the wavelength spectrum of the ambient light filter structure with IR blocking characteristics according to an embodiment of the present invention and human eyes.

As shown in FIG. 3, the chart introduces two responses, the first response 31 is the response of the ambient light filter structure according to the present invention and the second response 32 is that of the ideal human eye. Obviously, regarding the first response 31, the wavelength spectrum ranging from 700 nm to 1100 nm is effectively blocked by the ambient light filter structure and the response of the ambient light filter structure is proximate to the response of the ideal human eye at the range of 400 nm to 700 nm. The peak wavelength of the ambient light filter structure locates at around 555 nm 312. The spectral response of the ambient light filter structure substantially matches the response of the human eye.

Figure 4:
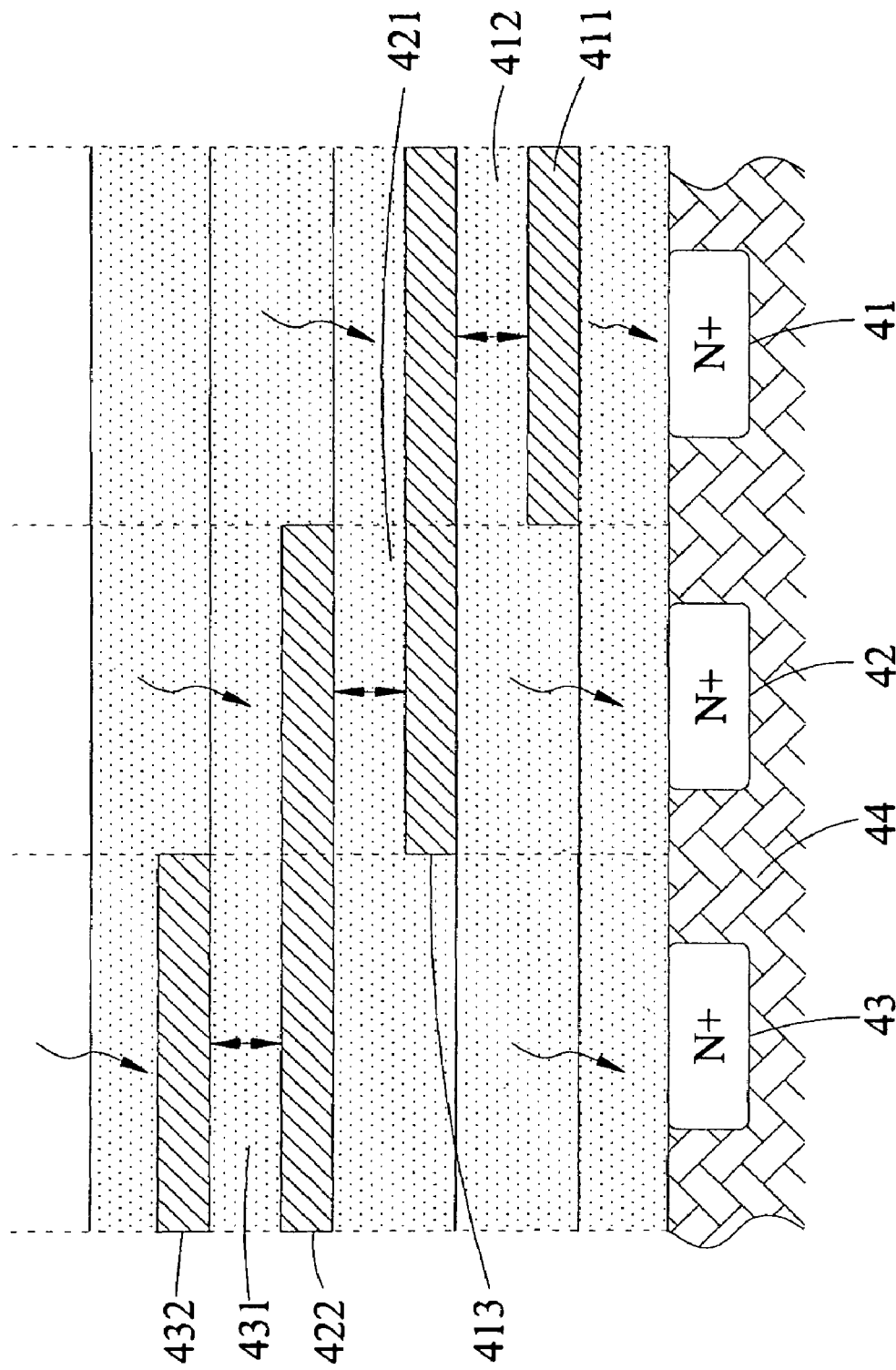
FIG. 4 is a cross-sectional diagram explaining an example of the composition of multi-cavity Fabry-Perot ambient light sensing system explaining an example of the composition of a Fabry-Perot filter stack for ambient color sensing according to an embodiment of the present invention.

Next, a multi-cavity Fabry-Perot ambient light color filter stack structure will be explained. FIG. 4 shows a cross-sectional diagram of a multi-cavity Fabry-Perot ambient light color filter stack structure according to an embodiment of the present invention. The multi-cavity Fabry-Perot ambient light color filter stack structure is deposited on a photodiode array element (44) which comprises three photodiodes (41, 42, 43), such as the N+/P-substrate photodiodes shown in FIG. 4. The multi-cavity Fabry-Perot ambient light color filter stack structure comprises seven layers, they are: a first silver (Ag) partially reflective layer 411 deposited to cover the region of the first photodiode 41; a first silicon nitride ($Si_3N_4$) interferometric layer 412 deposited on the first silver partially reflective layer 411; a second silver (Ag) partially reflective layer 413 deposited the first silicon nitride interferometric layer 412 and the region of the second photodiode 42; a second silicon nitride ($Si_3N_4$) interferometric layer 421 deposited on the second silver partially reflective layer 413 to cover the region of the second photodiode 42; a third silver (Ag) partially reflective layer 422 deposited to cover both the second silicon nitride interferometric layer 421 and the region of the third photodiode 43; a third silicon nitride ($Si_3N_4$) interferometric layer 431 deposited on the third silver partially reflective layer 422 to cover the region of the third photodiode 43; and a fourth silver (Ag) partially reflective layer 432 deposited on the third silicon nitride interferometric layer 431. The first silver partially reflective layer 411, the first silicon nitride interferometric layer 412, and the second silver partially reflective layer 413 constitute a first Fabry-Perot optical cavity. The second silver partially reflective layer 413, the second silicon nitride interferometric layer 421, and the third silver partially reflective layer 422 constitute a second Fabry-Perot optical cavity. The third silver partially reflective layer 422, the third silicon nitride interferometric layer 431, and the fourth silver partially reflective layer 432 constitute a third Fabry-Perot optical cavity. It should be noted that the second silver partially reflective layer 413 extends from the region of the first photodiode 41 to the region of the second photodiode 42; and the third silver partially reflective layer 422 extends from the region of the second photodiode 42 to the region of the third photodiode 43. In other words, the second silver partially reflective layer 413 is a common Fabry-Perot reflector shared by the first photodiode 41 and the second photodiode 42; and the third silver partially reflective layer 422 is a common Fabry-Perot reflector shared by the second photodiode 42 and the third photodiode 43. The multi-cavity Fabry-Perot ambient light color filter stack structure can be made as a stair stack according to the present invention. The first silicon nitride interferometric layer 412, the second silicon nitride interferometric layer 421, and the third silicon nitride interferometric layer 431 are the interferometric center dielectric layer of the ambient light color filter structure. The deposition thickness of each silicon nitride interferometric layer may be implemented using the modern thin film deposition equipment, such as the Plasma Enhanced Chemical Vapor Deposition, which is a well controlled thickness deposition process. The seven layers of the ambient light color filter stack structure are usually used for a three-color system. The three-color system is a three fundamental color separation that human eye can recognize such as red, green, and blue. The aforementioned region of the first photodiode 41 may be implemented for capturing blue light, with a peak value near 450 nm in the wavelength spectrum. The aforementioned region of the second photodiode 42 may be implemented for capturing green light with a peak value near 550 nm in the wavelength spectrum. The aforementioned region of the third photodiode 43 may be implemented for capturing red light with a peak value near 650 nm in the wavelength spectrum. Furthermore, this type of seven layers of the ambient light color filter structure offers a modular flexible filter stack solution (the modular Fabry-Perot filter cell is formed by two silver partially reflective layers plus a silicon nitride interferometric layer and the silicon nitride interferometric layer is placed between two silver component layers) for any additional color filtering and detection. Each additional color filter cell requires only an extra modular Fabry-Perot filter stack masking layer and silicon nitride interferometric thickness layer deposition defines a specific optical passing spectrum. The partially reflective layer such as silver deposition and mask photo patterning process is based on either lift-off or dry etching process to define the modular filter regions.

Figure 5:
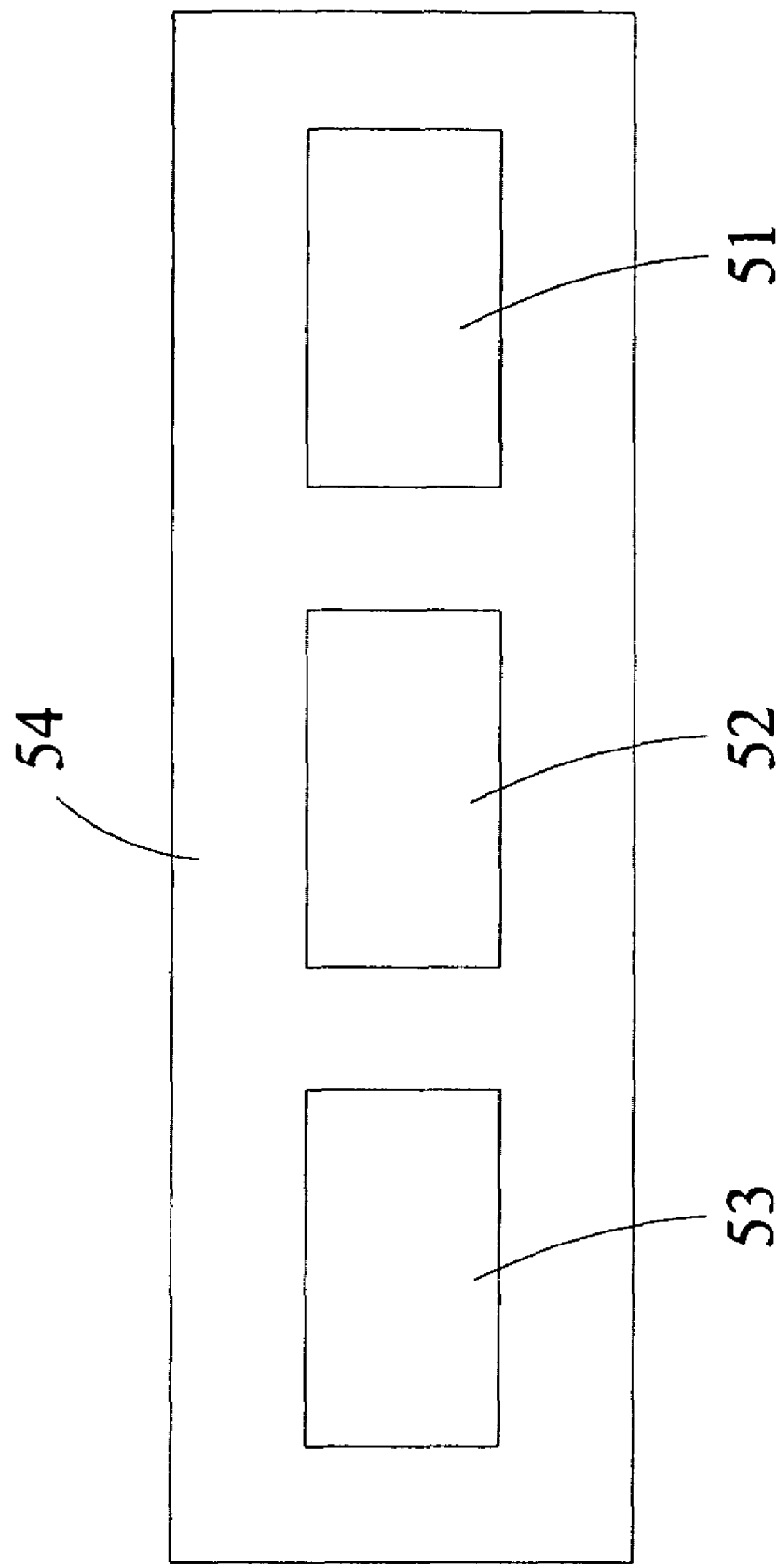
FIG. 5 is a top view explaining an example of three Fabry-Perot filter regions sensing the fundamental RGB color components according to an embodiment of the present invention.

FIG. 5 is a top view explaining an example of three fundamental color sensing regions of an ambient light color filter structure according to an embodiment of the present invention. The first rectangle 51 of the ambient light color filter, corresponding to the aforementioned region of the first photodiode 41, may be designed for capturing blue light. The second rectangle 52 of the ambient light color filter, corresponding to the aforementioned region of the second photodiode 42, may be designed for capturing green light. The third rectangle 53 of the ambient light color filter, corresponding to the aforementioned region of the third photodiode 43, may be designed for capturing red light.

Figure 6:
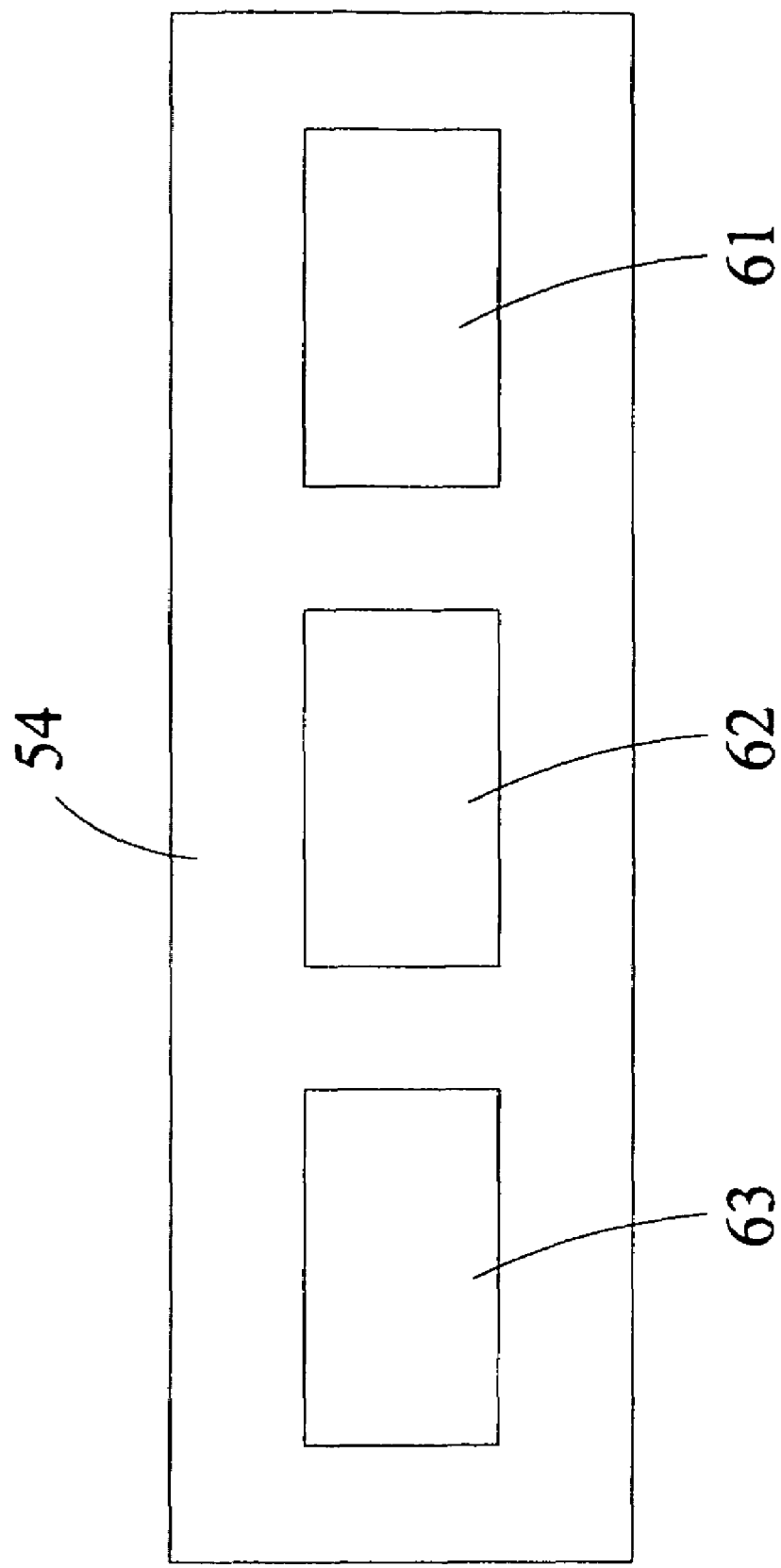
FIG. 6 is a top view explaining an example of three complementary RGB color sensing regions of a multi-cavity Fabry-Perot filter according to an embodiment of the present invention.

Besides the three rectangles for capturing each fundamental color by the ambient light color filter structure, they may also be implemented to capture complementary color. Please refer to FIG. 6, another bird's eye view of complementary color rectangles along with the ambient light color filter structure 54 according to an embodiment of the present invention is shown. The complementary color includes cyan, magenta, and yellow. Therefore, the first rectangle 61 of the ambient light color filter, corresponding to the aforementioned region of the first photodiode 41, may be designed to capture yellow light. The second rectangle 62 of the ambient light color filter, corresponding to the aforementioned region of the second photodiode 42, may be designed to capture magenta light. The third rectangle 63, corresponding to the aforementioned region of the third photodiode 43, may be designed to capture cyan light.

In summation of the description above, the present invention of multi-cavity Fabry-Perot filter stack filter structure is novel and useful and definite enhances the performance over the conventional CMOS polymer based RGB filter and further complies with the patent application requirements and is submitted to the Patent and Trademark Office for review and granting of the commensurate patent rights.

What is claimed is:

1. A multi-cavity Fabry-Perot ambient light filter apparatus comprising:
    a plurality of Fabry-Perot cavities, each of the plurality of Fabry-Perot cavities covering one of a plurality of photodiodes;
    wherein each of the plurality of Fabry-Perot cavities has two partially reflective layers and one interferometric layer sandwiched between the two partially reflective layers, and shares one of the two partially reflective layers with a neighboring Fabry-Perot cavity; each of said plurality of Fabry-Perot cavities disposed to form a stepped and stacked formation with the neighboring Fabry-Perot cavity.

2. The multi-cavity Fabry-Perot ambient light filter apparatus of claim 1, wherein thicknesses of the interferometric layers are different from one another, thereby producing different spectral responses among the plurality of Fabry-Perot cavities.

3. The multi-cavity Fabry-Perot ambient light filter apparatus of claim 2, wherein at least one of the plurality of Fabry-Perot cavities is capable of blocking infrared portions of the ambient light except for a wavelength region that is recognizable by human eyes.

4. The multi-cavity Fabry-Perot ambient light filter apparatus of claim 3, wherein the wavelength region is chosen from a group consisting of a red-wavelength spectrum, a green-wavelength spectrum, a blue-wavelength spectrum, a cyan-wavelength spectrum, a magenta-wavelength spectrum and a yellow-wavelength spectrum.

5. The multi-cavity Fabry-Perot ambient light filter apparatus of claim 1, wherein the partially reflective layers comprise silver thin films.

6. The multi-cavity Fabry-Perot ambient light filter apparatus of claim 1, wherein the interferometric layers comprise silicon nitride thin films.

7. The multi-cavity Fabry-Perot ambient light filter apparatus of claim 6, wherein the silicon nitride thin films comprise $Si_3N_4$.

8. The multi-cavity Fabry-Perot ambient light filter apparatus of claim 1, wherein a bottom spacer layer is deposited under each of the plurality of Fabry-Perot cavities.

9. The multi-cavity Fabry-Perot ambient light filter apparatus of claim 1, wherein a top moisture-protective layer is deposited on each of the plurality of Fabry-Perot cavities.

10. The multi-cavity Fabry-Perot ambient light filter apparatus of claim 1, wherein the multi-cavity Fabry-Perot ambient light filter apparatus is made according to Complementary Metal Oxide Semiconductor (CMOS) technology, bipolar technology, or Bi-Complementary Metal Oxide Semiconductor (BiCMOS) technology.

11. A multi-cavity Fabry-Perot ambient light filter apparatus comprising:
    a first Fabry-Perot cavity, having a first partially reflective layer, a second partially reflective layer and a first interferometric layer deposited between the first partially reflective layer and the second partially reflective layer; and
    a second Fabry-Perot cavity, having a third partially reflective layer, a fourth partially reflective layer and a second interferometric layer deposited between the third partially reflective layer and the fourth partially reflective layer;
    wherein the second Fabry-Perot cavity is forms a stepped stack on the first Fabry-Perot cavity such that the second partially reflective layer and the third partially reflective layer form a shared first common partially reflective layer, and the first partially reflective layer and the fourth partially reflective layer are physically distinct partially reflective layers.

12. The multi-cavity Fabry-Perot ambient light filter apparatus of claim 11, further comprising:

a third Fabry-Perot cavity, having a fifth partially reflective layer, a sixth partially reflective layer and a third interferometric layer deposited between the fifth partially reflective layer and the sixth partially reflective layer;

wherein the third Fabry-Perot cavity forms a stepped stack on the second Fabry-Perot cavity such that the fourth partially reflective layer and the fifth partially reflective layer form a shared second common partially reflective layer, and the third partially reflective layer and the sixth partially reflective layer are physically distinct partially reflective layers.

13. The multi-cavity Fabry-Perot ambient light filter apparatus of claim 12, wherein spectral responses of the first Fabry-Perot cavity, the second Fabry-Perot cavity and the third Fabry-Perot cavity are different.

14. The multi-cavity Fabry-Perot ambient light filter apparatus of claim 13, wherein the spectral response of the first Fabry-Perot cavity comprises a red-wavelength spectrum, the spectral response of the second Fabry-Perot cavity comprises a green-wavelength spectrum, and the spectral response of the third Fabry-Perot cavity comprises a blue-wavelength spectrum.

15. The multi-cavity Fabry-Perot ambient light filter apparatus of claim 14, wherein the red-wavelength spectrum comprises a peak value near 650 nm.

16. The multi-cavity Fabry-Perot ambient light filter apparatus of claim 14, wherein the green-wavelength spectrum comprises a peak value near 550 nm.

17. The multi-cavity Fabry-Perot ambient light filter apparatus of claim 14, wherein the blue-wavelength spectrum comprises a peak value near 450 nm.

18. The multi-cavity Fabry-Perot ambient light filter apparatus of claim 13, wherein the spectral response of the first Fabry-Perot cavity comprises a cyan-wavelength spectrum, the spectral response of the second Fabry-Perot cavity comprises a magenta-wavelength spectrum, and the spectral response of the third Fabry-Perot cavity comprises a yellow-wavelength spectrum.

19. The multi-cavity Fabry-Perot ambient light filter apparatus of claim 12, wherein the thicknesses of the first interferometric layer, the second interferometric lay and the third interferometric layer are different.

20. The multi-cavity Fabry-Perot ambient light filter apparatus of claim 12, wherein the first Fabry-Perot cavity, the second Fabry-Perot cavity and the third Fabry-Perot cavity are made according to Complementary Metal Oxide Semiconductor (CMOS) technology, bipolar technology, or Bi-Complementary Metal Oxide Semiconductor (BiCMOS) technology.

* * * * *